United States Patent
Lee et al.

(10) Patent No.: US 9,413,304 B2
(45) Date of Patent: Aug. 9, 2016

(54) ELECTRONIC DEVICE AND CONTROL METHOD THEREOF

(71) Applicant: Samsung Electronics Co., Ltd., Suwon-si (KR)

(72) Inventors: Jae-cheol Lee, Yongin-si (KR); Byung-soo Kim, Seoul (KR); Joo-moon Youn, Seoul (KR); Kee-yeong Cho, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 81 days.

(21) Appl. No.: 14/139,907

(22) Filed: Dec. 24, 2013

(65) Prior Publication Data

US 2014/0176237 A1  Jun. 26, 2014

(30) Foreign Application Priority Data

Dec. 24, 2012 (KR) .................. 10-2012-0152197

(51) Int. Cl.
*H03F 1/00* (2006.01)
*H03F 3/02* (2006.01)
*H03F 3/181* (2006.01)
*H03F 3/20* (2006.01)
*H03F 5/00* (2006.01)

(52) U.S. Cl.
CPC .................. *H03F 3/02* (2013.01); *H03F 3/181* (2013.01); *H03F 3/20* (2013.01); *H03F 5/00* (2013.01)

(58) Field of Classification Search
CPC ................ H03F 1/00; H03F 3/54; H03F 3/58
USPC .............................. 330/127, 128, 41–44, 297
See application file for complete search history.

(56) References Cited

U.S. PATENT DOCUMENTS

| | | | | |
|---|---|---|---|---|
| 2,040,014 A | * | 5/1936 | Moseley | 318/619 |
| 2,084,180 A | | 6/1937 | Barton | |
| 2,207,450 A | * | 7/1940 | Bergan et al. | 84/454 |
| 2,357,237 A | * | 8/1944 | Thompson | 455/354 |
| 2,423,540 A | * | 7/1947 | Wills | 318/668 |
| 2,440,289 A | * | 4/1948 | Pensyl | 342/92 |
| 2,519,615 A | * | 8/1950 | Wannamaker, Jr. | 703/3 |
| 2,523,017 A | * | 9/1950 | Harrison | 340/632 |
| 2,527,893 A | * | 10/1950 | Smith | 318/763 |
| 2,540,089 A | * | 2/1951 | Barker | 342/69 |
| 2,554,717 A | * | 5/1951 | Mouzon | 318/629 |

(Continued)

FOREIGN PATENT DOCUMENTS

CA                391667 A        10/1940

OTHER PUBLICATIONS

European Search Report dated May 2, 2014 issued by the European Patent Office in counterpart European Patent Application No. 13198647.3.

*Primary Examiner* — Henry Choe
(74) *Attorney, Agent, or Firm* — Sughrue Mion, PLLC (57) ABSTRACT

An electronic device includes an amplifier which is configured to amplify a sound signal and includes a vacuum tube including a heater configured to heat the vacuum tube; a voltage supply which is configured to supply a first voltage and a second voltage which is higher than the first voltage; and a controller which is configured to control the voltage supply to supply the second voltage to the heater in response to supply of a drive voltage to the amplifier being started and to supply the first voltage to the heater if the vacuum tube reaches a predetermined temperature.

7 Claims, 8 Drawing Sheets

(56) References Cited

U.S. PATENT DOCUMENTS

| | | | |
|---|---|---|---|
| 2,601,583 A * | 6/1952 | Ballou | 315/94 |
| 2,872,588 A * | 2/1959 | Barton, Jr. | 250/210 |
| 3,305,000 A * | 2/1967 | Bullen et al. | 165/260 |
| 2004/0257158 A1 | 12/2004 | Mieda | |

* cited by examiner

ELECTRONIC DEVICE AND CONTROL METHOD THEREOF

CROSS-REFERENCE TO RELATED APPLICATION

This application claims priority from Korean Patent Application No. 10-2012-0152197, filed on Dec. 24, 2012 in the Korean Intellectual Property Office, the disclosure of which is incorporated herein by reference.

BACKGROUND

1. Field

Apparatuses and methods consistent with exemplary embodiments relate to an electronic device and a control method thereof, and more particularly to an electronic device which can rapidly preheat a vacuum tube in an initial operation of the electronic device for rapid use of a vacuum tube audio amplifier, and a control method thereof.

2. Description of the Related Art

Many people enjoy listening to music using a vacuum tube audio amplifier. However, there are several problems with using an electronic device including the vacuum tube audio amplifier.

Currently, in order to normally use a vacuum tube audio amplifier, it is necessary to preheat a vacuum tube, which takes time. If the vacuum tube is not preheated, a user cannot obtain desired sound quality. In order to normally operate the vacuum tube audio amplifier, it is necessary to apply electric current to a heater to preheat the vacuum tube. That is, the vacuum tube should reach a normal operation temperature by preheating.

In the related art, a vacuum tube audio amplifier includes a heater which preheats a vacuum tube without using an additional circuit, which takes relatively long time for a general user.

SUMMARY

One or more exemplary embodiments may provide an electronic device which allows a user to rapidly preheat a vacuum tube in an initial operation of an electronic device for rapid use of a vacuum tube audio amplifier, and a control method thereof.

According to an aspect of an exemplary embodiment, there is provided an electronic device including: an amplifier which is configured to amplify a sound signal and includes a vacuum tube including a heater configured to heat the vacuum tube; a voltage supply which is configured to supply a first voltage and a second voltage which is higher than the first voltage; and a controller which controls the voltage supply to supply the second voltage to the heater when supply of a drive voltage to the amplifier is started and to supply the first voltage to the heater if the vacuum tube reaches a predetermined temperature.

The electronic device further may include a switch which selectively applies voltage, wherein the controller is configured to control the switch to perform switching for supply of a standby voltage to the vacuum tube when the amplifier enters a standby state and for supply of the first voltage or the second voltage to the vacuum tube when the supply of the drive voltage to the amplifier is restarted.

The vacuum tube may include a temperature sensor configured to sense a temperature of the vacuum tube, and wherein the controller controls the voltage supply to supply the first voltage or the second voltage to the heater based on the temperature of the vacuum tube detected by the temperature sensor.

According to an aspect of another exemplary embodiment, there is provided a control method of an electronic device, the control method including: supplying a drive voltage to an amplifier which includes a vacuum tube provided with a heater; supplying a second voltage which is higher than a first voltage to the heater of the vacuum tube; and supplying the first voltage to the heater if the vacuum tube reaches a predetermined temperature.

The method further may include supplying a standby voltage to the vacuum tube when the supply of the drive voltage to the amplifier is cut off and the amplifier enters a standby state, and supplying the first voltage or the second voltage to the vacuum tube when the supply of the drive voltage to the amplifier is restarted.

The method further may include supplying the first voltage or the second voltage to the heater based on the temperature of the vacuum tube.

BRIEF DESCRIPTION OF THE DRAWINGS

The above and/or other aspects will become apparent and more readily appreciated from the following description of exemplary embodiments, taken in conjunction with the accompanying drawings, in which.

DETAILED DESCRIPTION OF EXEMPLARY EMBODIMENTS

Below, exemplary embodiments will be described in detail with reference to accompanying drawings so as to be easily realized by a person having ordinary knowledge in the art. The exemplary embodiments may be embodied in various forms without being limited to the exemplary embodiments set forth herein. Descriptions of well-known parts are omitted for clarity, and like reference numerals refer to like elements throughout.

Figure 1:
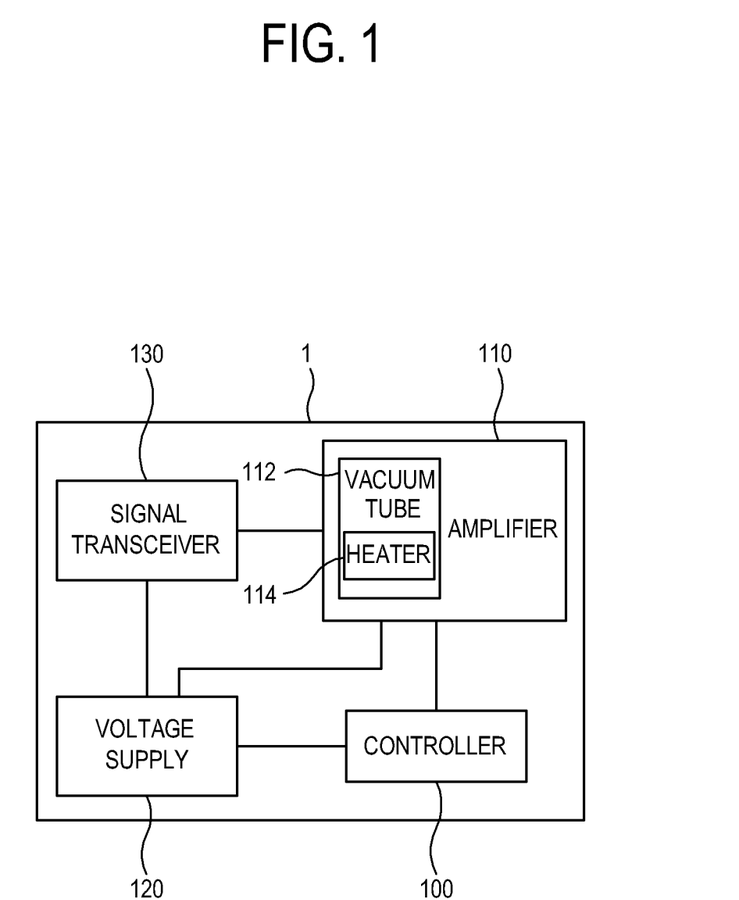
FIG. 1 is a block diagram illustrating a configuration of an electronic device according to an exemplary embodiment.

FIG. 1 is a block diagram illustrating a configuration of an electronic device 1 according to an exemplary embodiment.

As shown in FIG. 1, the electronic device 1 may include an amplifier 110, a voltage supply 120, a controller 100, and a signal transceiver 130.

In the electronic device 1, the amplifier 110 may include a vacuum tube 112 which amplifies a sound signal, and the vacuum 112 may include a heater 114. The voltage supply 120 may supply one of a first voltage and a second voltage, which is higher than the first voltage, to the heater 114. The controller 100 may control the voltage supply 120 to supply the second voltage to the heater 114 when supply of a drive voltage to the amplifier 110 is started, and to supply the first voltage to the heater 114 when the vacuum tube 112 reaches a predetermined temperature.

The signal transceiver 130 may transmit a signal received from an external device or source to the amplifier 100, and may be realized in various forms according to the characteristic and standard of the received signal, the types of the external device or source, the type of the electronic device 1, or the like. For example, the signal transceiver 130 may receive a signal or data according to a standard such as a high definition multimedia interface (HDMI), a universal serial bus (USB), a component or the like, and may include at least one connector corresponding to the standard.

The signal transceiver 130 may also transmit information, data or a signal of the electronic device 1 to the external device or source. That is, the signal transceiver 130 may be provided with an interface capable of two-way communication for signal reception and transmission with respect to the external device or source.

The amplifier 110 amplifies an input sound signal. The amplification is performed to enlarge the waveform, voltage or current of the signal. To this end, a low frequency amplifier is typically used in the audio field. As described above, the amplifier 110 may include the vacuum tube 112. The vacuum tube 112 may amplify a sound signal, and may output the amplified sound signal. In the vacuum tube 112, if the heater 114 is turned on in vacuum, a plate which surrounds the heater 114 is heated to emit electrons. Then, the emitted electrons move to a cathode. In the course of movement of the electrons, an appropriate voltage is applied to a grid electrode, and thus, properties of the electrons are changed, to thereby achieve the sound signal amplification.

The heater 114 included in the vacuum tube 112 may have a heating function. The heater 114 may preheat the vacuum tube 112, and may emit heat to maintain an appropriate temperature during the sound signal amplification.

The amplifier 110 according to the present exemplary embodiment is different from a speaker which simply increases a sound output in that the amplifier 110 outputs sound with high quality without distortion of a sound signal received through the signal transceiver 130.

As described above, the voltage supply 120 may supply the first voltage or the second voltage, which is higher than the first voltage, to the heater 14. Here, the first voltage may be a DC voltage of 6.3V which is supplied to generate heat for normal sound amplification of the vacuum tube 112, and the second voltage may be a DC voltage of 12.6V which is supplied to rapidly preheat the heater 114 of the vacuum tube 112.

The voltage supply 120 may include a converter (not shown) which changes the size of a DC voltage to supply an output voltage. The converter may include a resistor mounted on a printed circuit board (not shown). Alternatively, the voltage supply 120 may selectively supply the first voltage or the second voltage by switching.

As described above, the controller 100 may control the voltage supply 120 to supply the second voltage to the heater 114 when the supply of the drive voltage to the amplifier 110 is started, and to supply the first voltage to the heater 114 when the vacuum tube 112 reaches the predetermined temperature.

If the drive voltage is supplied to the electronic device 1, the voltage supply 120 may supply voltage to the amplifier 110, that is, to the heater 114 to preheat the vacuum tube 112. Here, the second voltage, instead of the first voltage, is supplied to the heater 114 to rapidly preheat the vacuum tube 112. Then, if the vacuum tube 112 reaches the predetermined temperature, the voltage supply 120 may supply the first voltage, instead of the second voltage, to the heater 114.

Figure 2:
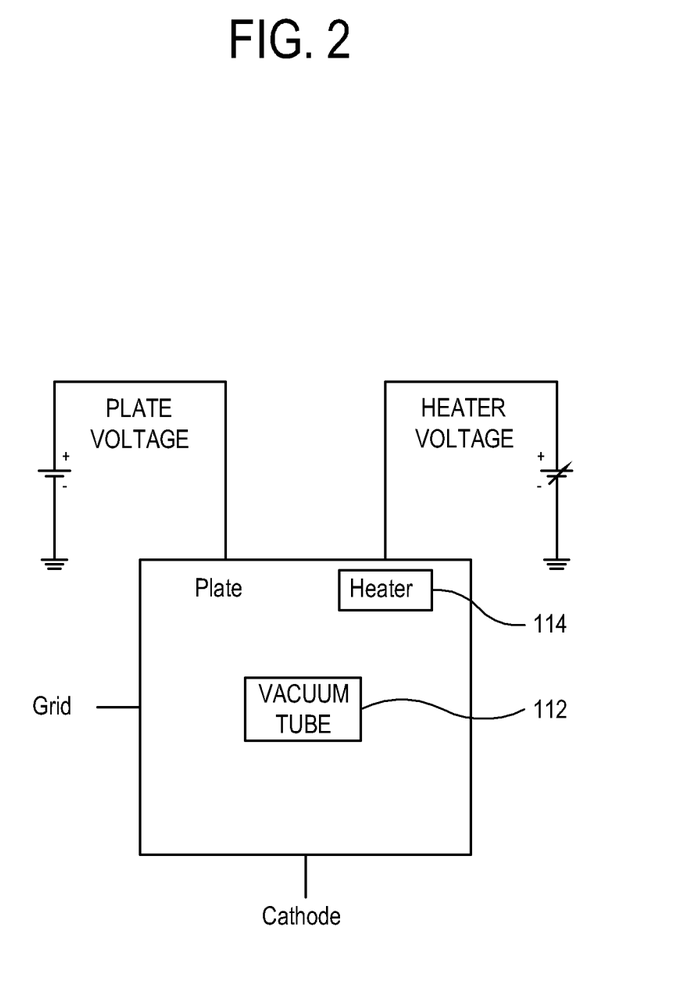
FIG. 2 is a schematic circuit diagram illustrating a process of supplying a second voltage to preheat a vacuum tube of an electronic device, according to an exemplary embodiment.

FIG. 2 is a circuit diagram illustrating a process of supplying the second voltage to preheat the vacuum tube 112 of the electronic device 1, according to an exemplary embodiment.

The vacuum tube 112 includes a plate, the heater 114, a cathode and a grid electrode. The plate surrounds the heater 114. In order to preheat the vacuum tube 112 using the heater 114, in response to the drive voltage being supplied to the electronic device 1, the heater 114 is turned on by the second voltage higher than the first voltage which is a normal voltage.

Here, as the heater 114 is turned on in vacuum of the vacuum tube 112, the plate which surrounds the heater 114 is heated to emit electrons. Then, the emitted electrons move to the cathode. In the course of the movement of the electrons, an appropriate voltage is applied to the grid electrode, and thus, properties of the electrons are changed due to electron amplification, to thereby achieve sound amplification.

Referring to FIGS. 1 and 2, if the drive voltage is supplied to the electronic device 1, the voltage supply 120 supplies voltage to the amplifier 110, and accordingly, to the heater 114 of the vacuum tube 112. Here, while the first voltage is supplied to the heater 114 in the related art, the second voltage higher than the first voltage is supplied to the heater 114 under the control of the controller 100, according to the present exemplary embodiment. The voltage supply 120 may adjust the voltage using a converter to supply the first voltage or the second voltage. As the second voltage is supplied to the heater 114, the vacuum tube 112 may be rapidly preheated. Then, if the vacuum tube 112 reaches the predetermined temperature, the voltage supply 120 may change the second voltage to the first voltage to supply the first voltage to the heater 114.

Figure 3:
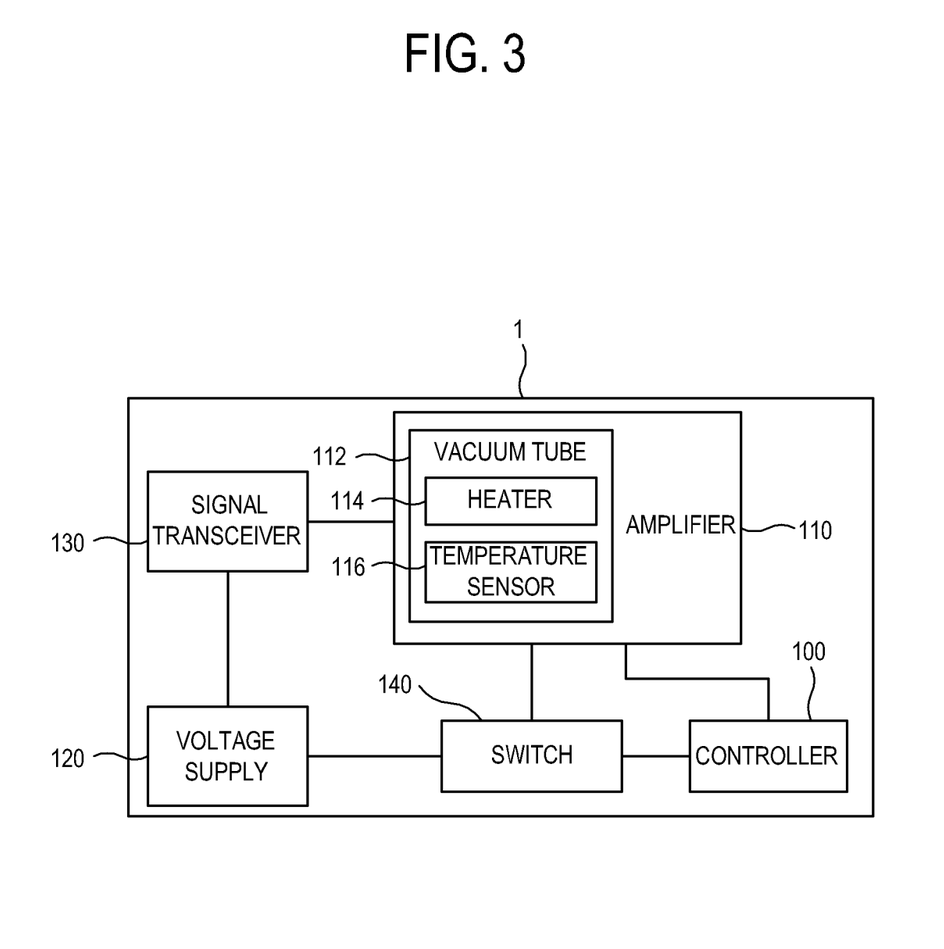
FIG. 3 is a block diagram illustrating a configuration of an electronic device according to an exemplary embodiment.

FIG. 3 is a block diagram illustrating a configuration of an electronic device according to another exemplary embodiment. As shown in FIG. 3, an electronic device 1 according to the present exemplary embodiment may further include a switch 140 and a temperature sensor 116 as compared with the electronic device 1 shown in FIG. 1.

In the electronic device 1 according to the present exemplary embodiment, in response to the drive voltage being supplied to the electronic device 1, the second voltage is supplied to the heater 114 of the vacuum tube 112. Then, if the vacuum tube 112 reaches the predetermined temperature, the first voltage is supplied to the heater. Here, the supply of the drive voltage to the electronic device 1 may be cut off. In this case, the controller 100 may control the switch 140 to supply a standby voltage lower than the first voltage to the vacuum tube 112 from the voltage supply 120.

The temperature sensor 116 may detect the temperature of the vacuum tube 112. For example, in the electronic device 1 according to the present exemplary embodiment, when the second voltage is supplied to the heater 114 to preheat the vacuum tube 112, the temperature sensor 116 may detect the temperature of the vacuum tube 112 and may transmit the result to the controller 100. If the vacuum tube 112 reaches the predetermined temperature, the controller 100 may control the voltage supply 120 to change the second voltage to the first voltage to supply the first voltage to the heater 114.

The switch 140 may include a resistor that is provided to adjust voltage. If the supply of the drive voltage to the electronic device 1 is cut off, the switch 140 may adjust the voltage through the resistor to obtain the standby voltage. Thus, the switch 140 may supply the standby voltage to the heater 114. Thereafter, if the drive voltage is again supplied to the electronic device 1, the voltage supply 120 may supply the first voltage or the second voltage. With this configuration, it is possible to preheat the vacuum tube 112 using the standby voltage even when the drive voltage is not supplied to the electronic device 1, and to rapidly preheat the vacuum tube 112 when the drive voltage is again supplied to the electronic device 1.

Figure 4:
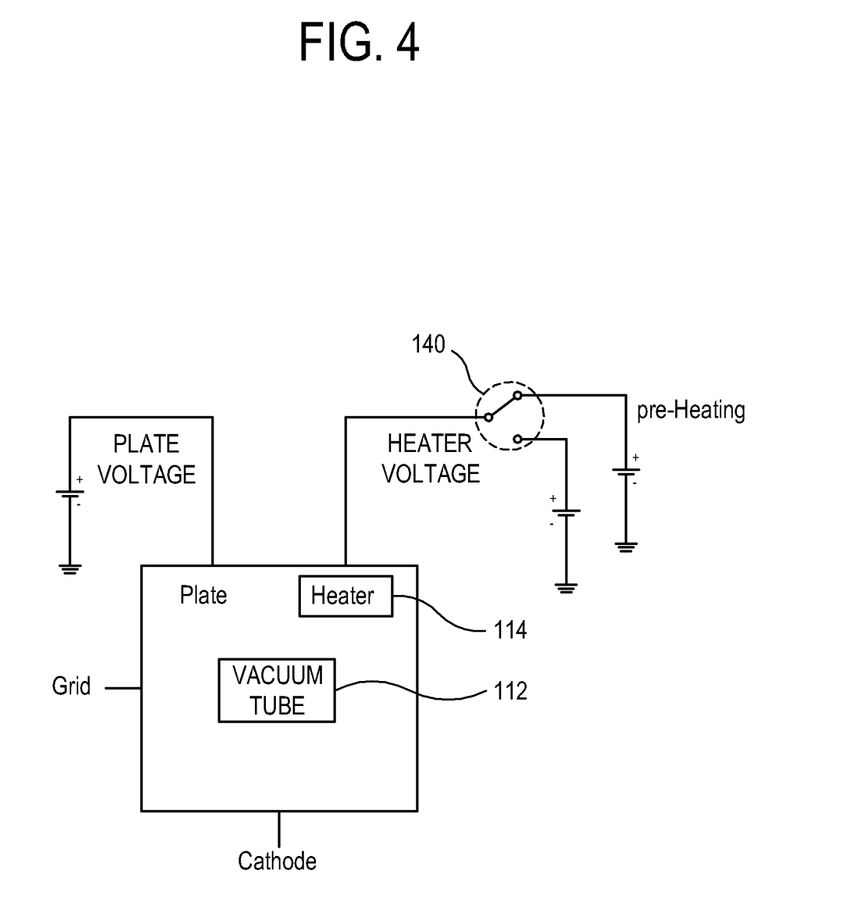
FIG. 4 is a schematic circuit diagram illustrating a process of supplying a standby voltage and first and second voltages to preheat a vacuum tube of an electronic device, according to an exemplary embodiment.

FIG. 4 is a schematic circuit diagram illustrating a process of supplying the standby voltage and the first and second voltages to preheat the vacuum tube 112 of the electronic device 1, according to an exemplary embodiment. Referring to FIG. 4, if the drive voltage is not supplied to the electronic device 1, the standby voltage is supplied to the heater 114 of the vacuum tube 112 through the switch 140 under the control of the controller 100, to thereby perform the preheating operation until the drive voltage is again supplied to the electronic device 1.

As shown in FIG. 4, a power line for supplying the first voltage and the second voltage and a power line for supplying the standby voltage may be separately provided. The two power lines are switched by the switch 140 under the control of the controller 100, to thereby supply the different voltages. That is, if the drive voltage is not supplied to the electronic device 1, the standby voltage is supplied, and if the drive voltage is supplied to the electronic device 1, the first voltage or the second voltage is supplied. As described above, the first voltage or the second voltage is selectively supplied under the control of the controller 100. Here, the second voltage may be first supplied to the vacuum tube 112, and then, if the vacuum tube 112 reaches the predetermined temperature, the first voltage is supplied.

Figure 5:
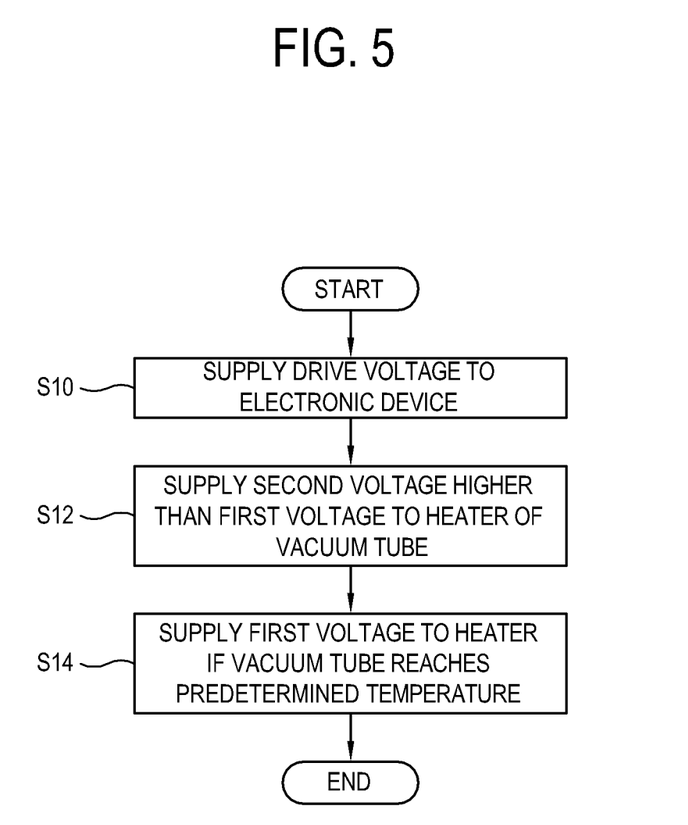
FIG. 5 is a control flowchart illustrating operation of an electronic device according to an exemplary embodiment.

FIG. 5 is a control flowchart illustrating operation of the electronic device 1 according to an exemplary embodiment.

First, the drive voltage is supplied to the electronic device 1 (S10). The drive voltage is supplied to the voltage supply 120, and is then supplied to the vacuum tube 112 of the amplifier 110. In response to supply of the drive voltage, the second voltage is supplied from the voltage supply 120 to the heater 114 of the vacuum tube 112 (S12). Since the second voltage, which higher than the first voltage, is supplied to the heater 114, the heater 114 is rapidly heated to rapidly preheat the vacuum tube 112. Then, when the vacuum tube 112 reaches the predetermined temperature, the voltage supply 120 changes the second voltage to the first voltage under the control of the controller 100, and supplies the first voltage to the heater 114 (S14).

Figure 6:
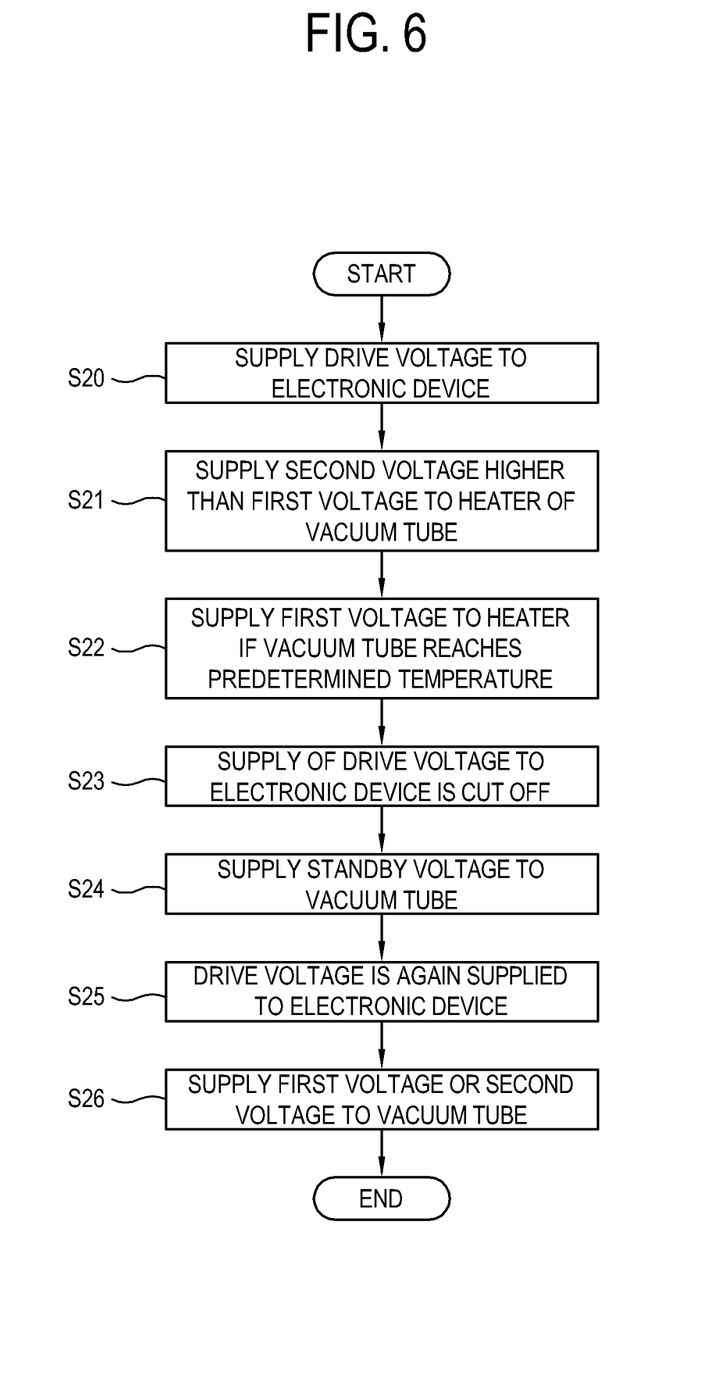
FIG. 6 is a control flowchart illustrating operation of an electronic device which supplies a standby voltage and first and second voltages to preheat a vacuum tube of the electronic device, according to an exemplary embodiment.

FIG. 6 is a control flowchart illustrating an operation of the electronic device 1 which supplies the standby voltage and the first and second voltages to preheat the vacuum tube 112 of the electronic device 1, according to an exemplary embodiment.

First, the drive voltage is supplied to the electronic device 1 (S20). The drive voltage is supplied to the voltage supply 120, and is then supplied to the vacuum tube 112 of the amplifier 110. In response to the drive voltage being supplied, the second voltage is supplied from the voltage supply 120 to the heater 114 of the vacuum tube 112 (S21). Since the second voltage, which is higher than the first voltage, is supplied to the heater 114, the heater 114 is rapidly heated to rapidly preheat the vacuum tube 112. Then, if the vacuum tube 112 reaches the predetermined temperature, the voltage supply 120 changes the second voltage to the first voltage under the control of the controller 100, and supplies the first voltage to the heater 114 (S22). Next, the supply of the drive voltage to the electronic device 1 is cut off by a user (S23). In response to supply of the drive voltage being cut off, the controller 100 controls the switch 140 to perform switching for supply of the standby voltage. Thus, the standby voltage is supplied to the heater 114 of the vacuum 112 (S24). Since the standby voltage is lower than the first voltage, a large amount of heat does not occur in heating the vacuum tube 112. Further, the standby voltage may be changed according to the type of the electronic device 1. In this case, it is possible to suppress overheating of the vacuum tube 112 using the temperature sensor 116. Then, the drive voltage is again supplied to the electronic device 1 by the user (S25). The controller 100 controls the switch 140 to perform switching for supply of the first voltage or the second voltage. Thus, the voltage supply 120 supplies the first voltage or the second voltage to the heater 114 (S26). Here, the temperature of the vacuum tube 112 is similarly detected by the temperature sensor 116. If the detected temperature is lower than the predetermined temperature, the second voltage is supplied to the heater 114, and if the detected temperature is equal to or higher than the predetermined temperature, the first voltage is supplied to the heater 114.

Figure 7:
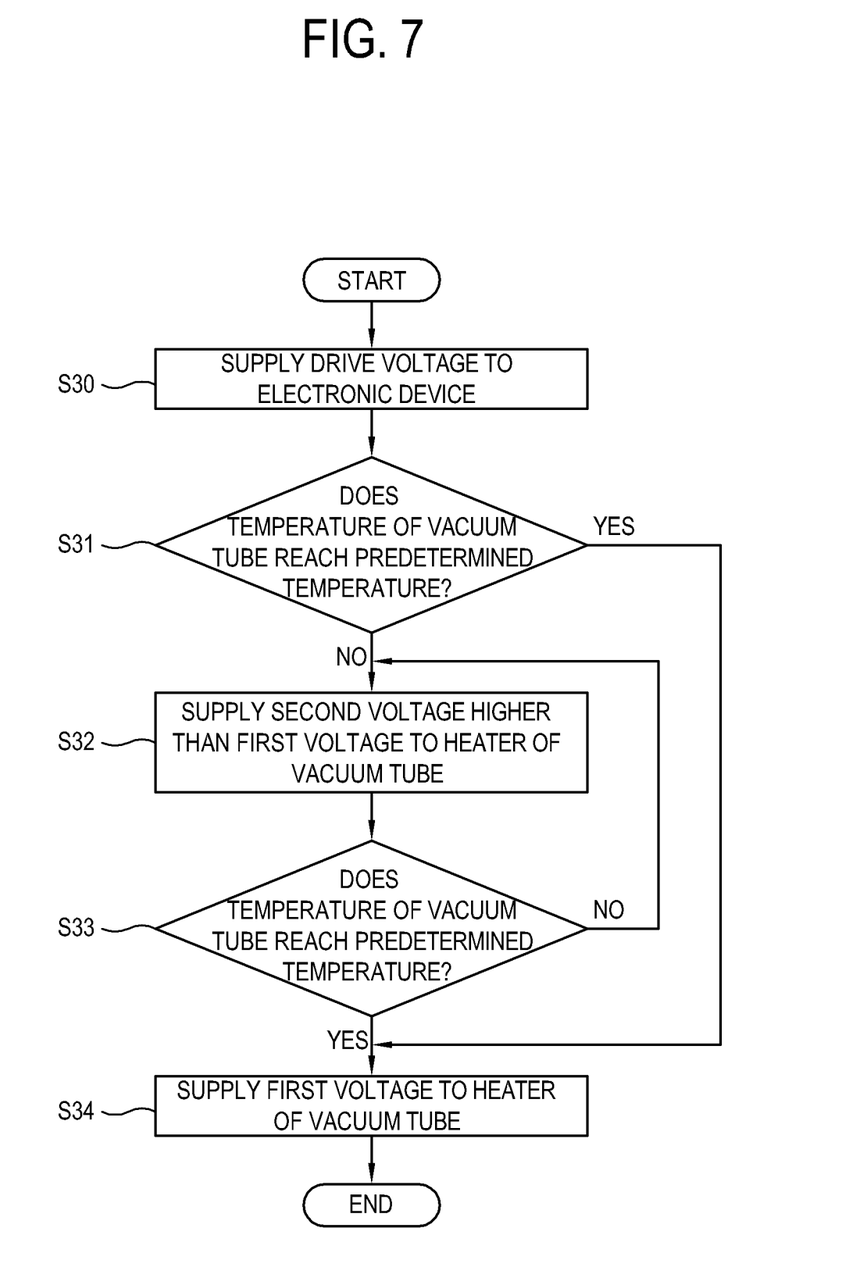
FIG. 7 is a control flowchart illustrating operation of an electronic device which preheats a vacuum tube using a temperature sensor, according to an exemplary embodiment.

FIG. 7 is a control flowchart illustrating an operation of the electronic device 1 which preheats the vacuum tube 112 using the temperature sensor 116, according to an exemplary embodiment.

First, the drive voltage is supplied to the electronic device 1 (S30). The drive voltage is supplied to the voltage supply 120, and is then supplied to the vacuum tube 112 of the amplifier 110. Then, the controller 100 determines whether the temperature of the vacuum tube 112 detected by the temperature sensor 116 is equal to or higher than the predetermined temperature (S31). If the detected temperature is equal to or higher than the predetermined temperature, the controller 100 controls the voltage supply 120 to supply the first voltage to the heater 114 of the vacuum tube 112. On the other hand, if the detected temperature is lower than the predetermined temperature, the controller 100 controls the voltage supply 120 to supply the second voltage to the heater 114 of the vacuum tube 112 (S32). Since the second voltage, which is higher than the first voltage, is supplied to the heater 114, the heater 114 is rapidly heated to rapidly preheat the vacuum tube 112. Then, the controller 100 determines whether the vacuum tube 112 reaches the predetermined temperature, using the temperature sensor 116 (S33). If the vacuum tube 112 has not reached the predetermined temperature, the controller 100 controls the voltage supply 120 to continue to supply the second voltage (S32). If the vacuum tube 112 reaches the predetermined temperature, the controller 100 controls the voltage supply 120 to change the second voltage to the first voltage and to supply the first voltage to the heater 114 (S34).

Figure 8:
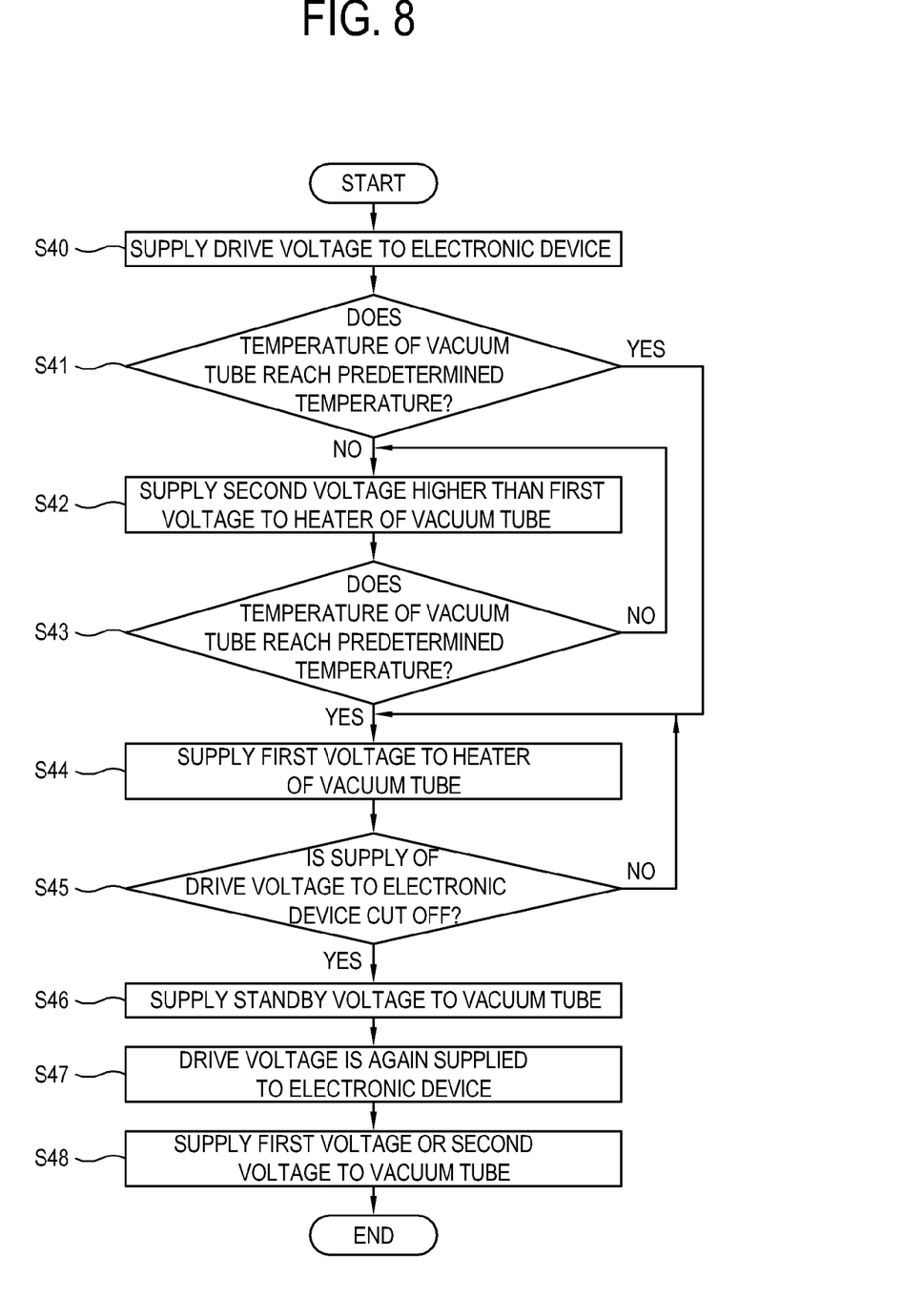
FIG. 8 is a control flowchart illustrating operation of an electronic device which supplies a standby voltage and first and second voltages to preheat a vacuum tube using a temperature sensor, according to an exemplary embodiment.

FIG. 8 is a control flowchart illustrating an operation of the electronic device 1 which supplies the standby voltage and the first and second voltages to preheat the vacuum tube 112 using the temperature sensor 116, according to an exemplary embodiment.

First, the drive voltage is supplied to the electronic device 1 (S40). The drive voltage is supplied to the voltage supply 120, and is then supplied to the vacuum tube 112 of the amplifier 110. The controller 100 determines whether the temperature of the vacuum tube 112 detected by the temperature sensor 116 is equal to or higher than the predetermined temperature (S41). If the detected temperature is equal to or higher than the predetermined temperature, the controller 100 controls the voltage supply 120 to supply the first voltage to the heater 114 of the vacuum tube 112. On the other hand, if the detected temperature is lower than the predetermined temperature, the controller 100 controls the voltage supply 120 to supply the second voltage to the heater 114 of the vacuum tube 112 (S42). Since the second voltage higher than the first voltage is supplied to the heater 114, the heater 114 is rapidly heated to rapidly preheat the vacuum tube 112. Then, the controller 100 determines whether the vacuum tube 112 reaches the predetermined temperature, using the temperature sensor 116 (S43). If the vacuum tube 112 has not reached the predetermined temperature, the controller 100 controls the voltage supply 120 to continue to supply the second voltage (S42). If the vacuum tube 112 reaches the predetermined temperature, the controller 100 controls the voltage supply 120 to change the second voltage to the first voltage and to supply the first voltage to the heater 114 (S44). Then, the controller 100 determines whether the supply of the drive voltage to the electronic device 1 is cut off by a user (S45). If the supply of the drive voltage is not cut off, the controller 100 controls the voltage supply 120 to continue to supply the first voltage (S44). If the supply of the drive voltage is cut off, the controller 100 controls the switch 140 to perform switching for supply of the standby voltage. Thus, the standby voltage is supplied to the heater 114 of the vacuum tube 112 (S46). Since the standby voltage is lower than the first voltage, a large amount of heat does not occur in heating the vacuum tube 112. Further, the standby voltage may be changed according to the type of the electronic device 1. Thus, it is possible to suppress overheating of the vacuum tube 112 using the temperature sensor 116. Then, the drive voltage is again supplied to the electronic device 1 by the user (S47). The controller 100 controls the switch 140 to perform switching for supply of the first voltage or the second voltage. Thus, the voltage supply 120 supplies the first voltage or the second voltage (S48). Here, the temperature of the vacuum tube 112 is similarly detected by the temperature sensor 116. Then, if the detected temperature is lower than the predetermined temperature, the second voltage is supplied to the heater 114, and if the detected temperature is equal to or higher than the predetermined temperature, the first voltage is supplied to the heater 114.

According to the above-described exemplary embodiments, it is possible to rapidly preheat the vacuum tube in an initial operation of the electronic device to allow rapid use of a vacuum tube audio amplifier.

Although a few exemplary embodiments have been shown and described, it will be appreciated by those skilled in the art that changes may be made in these exemplary embodiments without departing from the principles and spirit of the inventive concept, the scope of which is defined in the appended claims and their equivalents.

What is claimed is:

1. An electronic device comprising:
   an amplifier which is configured to amplify a sound signal and comprises a vacuum tube comprising a heater configured to emit heat to heat the vacuum tube;
   a voltage supply which is configured to supply a first voltage and a second voltage which is higher than the first voltage; and
   a controller which is configured to control the voltage supply to supply the second voltage to the heater in response to supply of a drive voltage to the amplifier being started and control the voltage supply to supply the first voltage to the heater in response to a temperature of the vacuum tube reaching a predetermined temperature,
   wherein the vacuum tube comprises a temperature sensor configured to sense the temperature of the vacuum tube, and
   wherein the controller controls the voltage supply to supply the first voltage or the second voltage to the heater based on the temperature of the vacuum tube sensed by the temperature sensor.

2. The electronic device according to claim 1, further comprising:
   a switch which is configured to selectively supply voltage,
   wherein the controller is configured to control the switch to perform switching to supply a standby voltage to the vacuum tube in response to the amplifier entering a standby state and to supply the first voltage or the second voltage to the vacuum tube in response to the supply of the drive voltage to the amplifier being restarted.

3. A control method of an electronic device, the control comprising:
   supplying a drive voltage to an amplifier which comprises a vacuum tube comprising a heater configured to heat the vacuum tube;
   supplying a second voltage, that is higher than a first voltage, to the heater of the vacuum tube in response to the drive voltage being supplied to the amplifier; and
   supplying the first voltage to the heater in response to the vacuum tube reaching a predetermined temperature,
   wherein the supplying the first voltage and the second voltage comprises selectively supplying one of the first voltage and the second voltage to the heater based on the temperature of the vacuum tube.

4. The control method according to claim 3, further comprising:
   supplying a standby voltage to the vacuum tube in response to the supply of the drive voltage to the amplifier being cut off and the amplifier entering a standby state; and
   supplying the first voltage or the second voltage to the vacuum tube in response to the supply of the drive voltage to the amplifier being restarted.

5. An electronic device comprising:
   an amplifier which is configured to amplify a sound signal and comprises a vacuum tube comprising a heater configured to emit heat to heat the vacuum tube;
   a voltage supply which is configured to supply a first voltage and a second voltage which is higher than the first voltage; and
   a controller which is configured to control the voltage supply to selectively supply one of the first voltage and the second voltage to the heater based on supply of a drive voltage to the amplifier and a temperature of the vacuum tube,
   wherein the controller controls the voltage supply to supply the second voltage to the heater in response to the supply of a drive voltage to the amplifier being started and control the voltage supply to supply the first voltage to the heater in response to a temperature of the vacuum tube reaching a predetermined temperature after the second voltage is supplied to the heater.

6. The electronic device according to claim 5, further comprising:
   a switch which is configured receive the first voltage and the second voltage supplied by the voltage supply and to supply the first voltage and the second voltage to the heater under the control of the controller,
   wherein the controller is configured to control the switch to perform switching to supply a standby voltage to the vacuum tube in response to the amplifier entering a standby state and to supply the first voltage or the second voltage to the vacuum tube in response to supply of the drive voltage to the amplifier being restarted.

7. The electronic device according to claim 5, wherein the vacuum tube further comprises a temperature sensor configured to sense the temperature of the vacuum tube, and
wherein the controller is configured to control the voltage supply to supply the first voltage or the second voltage to the heater based on the temperature of the vacuum tube sensed by the temperature sensor.

\* \* \* \* \*